US008933737B1

(12) United States Patent
Chatterjee et al.

(10) Patent No.: US 8,933,737 B1
(45) Date of Patent: Jan. 13, 2015

(54) SYSTEM AND METHOD FOR VARIABLE FREQUENCY CLOCK GENERATION

(71) Applicants: STMicroelectronics (Crolles 2) SAS, Crolles (FR); STMicroelectronics International N.V., Amsterdam (NL)

(72) Inventors: Kallol Chatterjee, Gananagar (IN); Nitin Agarwal, Kanpur (IN); Junaid Yousuf, Srinagar (IN); Nitin Gupta, Noida (IN); Pierre Dautriche, Montbonnot (FR)

(73) Assignees: STMicroelectronics International N.V., Amsterdam (NL); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/046,041

(22) Filed: Oct. 4, 2013

(30) Foreign Application Priority Data

Jun. 28, 2013 (IN) .......................... 1939/DEL/2013

(51) Int. Cl.
*H03L 7/06* (2006.01)
*H03L 7/095* (2006.01)

(52) U.S. Cl.
CPC ..................... *H03L 7/095* (2013.01)
USPC ............................ 327/159; 327/149; 327/158

(58) Field of Classification Search
USPC .................................. 327/147–149, 156–159
See application file for complete search history.

(56) References Cited

U.S. PATENT DOCUMENTS

| 5,101,178 | A  | * | 3/1992  | Komoda ..................... 331/158 |
| 6,201,434 | B1 | * | 3/2001  | Kanda et al. ................. 327/538 |
| 7,023,672 | B2 | * | 4/2006  | Goodfellow et al. ......... 361/18 |
| 7,030,707 | B2 | * | 4/2006  | Lee et al. ..................... 331/143 |
| 7,545,199 | B2 | * | 6/2009  | Lee et al. ..................... 327/530 |
| 7,852,640 | B2 | * | 12/2010 | Ye et al. .................... 363/21.12 |
| 8,085,102 | B2 | * | 12/2011 | Muller ........................ 331/111 |
| 2006/0221646 | A1 | * | 10/2006 | Ye et al. ......................... 363/13 |
| 2009/0067204 | A1 | * | 3/2009  | Ye et al. ......................... 363/97 |
| 2010/0165675 | A1 | * | 7/2010  | Ye et al. ......................... 363/39 |
| 2010/0172160 | A1 | * | 7/2010  | Ye et al. .................... 363/21.18 |
| 2010/0225404 | A1 | * | 9/2010  | Wood ............................ 331/57 |
| 2011/0038426 | A1 | * | 2/2011  | Koba et al. ................... 375/257 |
| 2011/0074468 | A1 | * | 3/2011  | Hsu et al. ..................... 327/101 |
| 2011/0292694 | A1 | * | 12/2011 | Ye et al. .................... 363/21.18 |
| 2012/0187991 | A1 |   | 7/2012  | Sathe et al. |
| 2012/0200273 | A1 | * | 8/2012  | Eom et al. .................... 323/271 |
| 2013/0307614 | A1 | * | 11/2013 | Dai ............................ 327/552 |
| 2014/0035690 | A1 | * | 2/2014  | Lee ............................ 331/175 |
| 2014/0091870 | A1 | * | 4/2014  | Morris ........................ 331/111 |
| 2014/0152361 | A1 | * | 6/2014  | Ma et al. ...................... 327/165 |

* cited by examiner

*Primary Examiner* — Adam Houston
(74) *Attorney, Agent, or Firm* — Gardere Wynne Sewell LLP

(57) ABSTRACT

A variable frequency clock generator. In aspects, a clock generator includes a droop detector circuit configured to monitor a voltage supply to an integrated circuit. If the supply voltage falls below a specific threshold, a droop voltage flag may be set such that a frequency-locked loop is triggered into a droop voltage mode for handling the voltage droop at the supply voltage. In response, a current control signal that is input to an oscillator that generates a system clock signal is reduced by sinking current away from the current control signal to the oscillator. This results in an immediate reduction on the system clock frequency. Such a state remains until the voltage droop has dissipated when the current path is removed for sinking some of the current.

29 Claims, 2 Drawing Sheets

SYSTEM AND METHOD FOR VARIABLE FREQUENCY CLOCK GENERATION

PRIORITY CLAIM

The instant application claims priority to Indian Patent Application No. 1939/DEL/2013, filed Jun. 28, 2013, which application is incorporated herein by reference in its entirety.

BACKGROUND

Integrated circuits and processors typically operate with a specific expected supply voltage. Maintaining a steady voltage supply assists with assuring that higher operating frequencies of various logic circuits in the integrated circuit and/or processor operates correctly with proper timing margins. However, if a lower voltage supply than required is encountered, this may cause timing failures, which can be catastrophic to the operation of the integrated circuit and/or processor.

The power requirements of a processor can vary drastically. For example, as part of its operation, code and logic may cause occasional spikes in processing activity, which may result in a sudden increase in power needed by the processor (e.g., current drawn). These significant and sudden changes in drawn power may cause significant droops (and overshoots) in the supplied voltage, even though the power supply is providing the rated voltage needed for the processor to operate at the desired frequency. It is desirous to mitigate any effects of these voltage droops

BRIEF DESCRIPTION OF THE DRAWINGS

The foregoing aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, an embodiment as described herein provides for a variable frequency clock generator. In aspects, an embodiment includes a clock generator having a voltage-droop detector circuit configured to monitor a supply voltage to an integrated circuit. If the supply voltage falls below a specific threshold, a voltage-droop flag may be set such that a frequency-locked loop is triggered into a voltage-droop mode for handling the voltage droop at the supply voltage. In response, a current control signal that is input to an oscillator (in the frequency-locked loop) that generates a system clock signal is reduced by sinking current away from the current control signal to the oscillator. This results in an immediate reduction on the system clock frequency which will alleviate current demands for the circuit by slowing down the operation of various components. Such a state remains until the voltage droop has dissipated when the current path is removed for sinking some of the current control signal. Further, various biasing functions are provided for biasing the current control signal back to an initial state after the voltage droop situation has been cleared. Various biasing functions may be used depending on the speed in which one desires that the frequency of the system click signal return to its initial frequency.

In conventional solutions to handling voltage droop, some problematic circuits would employ a multiplexor circuit in the signal path for the system clock. Thus, in response to detecting a voltage droop, these conventional systems would adjust the path of the clock signal through a series of multiplexors, effectively introducing delay into the clock signal. Thus, by adding unneeded delay, conventional clock generators attempted to "stretch" the initial clock signals by dividing down the frequency of the clock signal via delay elements in the large multiplexor. However, such large multiplexors are cumbersome and inefficient since additional circuitry is required that uses additional power. Thus, a solution that does not use any multiplexor-based frequency adjustment is desired.

Figure 1:
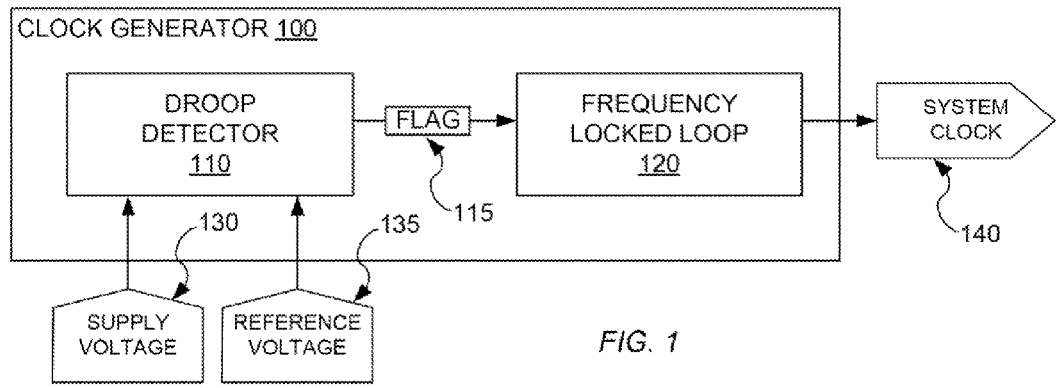
FIG. 1 shows a block diagram of a clock generation circuit according to an embodiment of the subject matter disclosed herein.

FIG. 1 shows a block diagram of a clock generation circuit 100 according to an embodiment of the subject matter disclosed herein. The clock generation circuit 100 may include, generally, two components for determining if and when the system clock signal 140 may be modified in response to a voltage-droop event. These two components, as shown in the embodiment of FIG. 1, include a voltage-droop detection circuit 110 and a frequency-locked loop circuit 120.

As will be described in greater detail below, the voltage-droop detection circuit 110 includes a supply voltage input signal 130 and a reference voltage input signal 135. The voltage-droop detection circuit is configured to compare the supply voltage 130 to the reference voltage 135. If the comparison yields a large enough deviation (e.g., the supply voltage falls below a specific threshold with respect to the reference voltage 135), then the voltage-droop detection circuit generates a voltage-droop flag 115. The voltage-droop detection circuit is described in greater detail below with respect to FIG. 3.

Keeping focus on FIG. 1 and this general overview of the clock generation circuit 100, the voltage-droop flag 115 may be input to the frequency-locked loop (FLL) circuit 120 as a trigger for entering or leaving a droop mode of operation. Generally, if the flag 115 is asserted, the FLL 120 will operate in a droop mode of operation wherein the frequency of the system clock signal 140 that is generated is reduced. If the flag 115 is de-asserted, the operating mode of the FLL 120 will return to a normal mode of operation. In other embodiments, the FLL 120 may be other kinds of clock generating circuitry, such as a phase-locked loop (PLL). The transition into and transition from these modes of operation are discussed in greater detail below with respect to FIG. 2.

Figure 2:
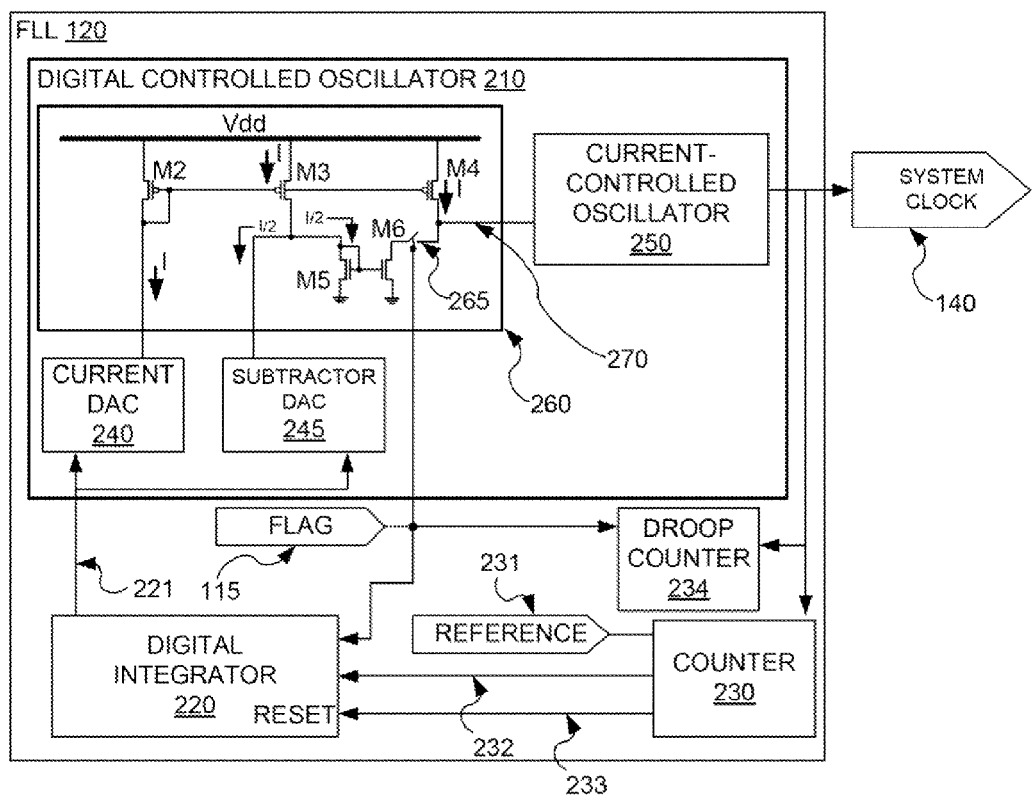
FIG. 2 shows a block diagram of a frequency-locked loop circuit that may be part of the clock generation circuit of FIG. 1 according to an embodiment of the subject matter disclosed herein.

Turning attention to FIG. 2, a block diagram is shown of a FLL circuit 120 that may be part of the clock generation circuit of FIG. 1 according to an embodiment of the subject matter disclosed herein. The FLL circuit 120 of FIG. 2 may typically be used to generate s system clock signal 140 to be used in circuits coupled to the clock generator 100 of FIG. 1. Such circuits may be disposed on the same integrated circuit die as the clock generator or on other integrated circuit dies or printed circuit boards coupled to the clock generator 100, such as separate processors and memories (shown in FIG. 4). Further, these circuits are also typically coupled to the overall supply voltage (130 of FIG. 1) such that as these various circuits perform operations, the voltage supplied by the power supply (not shown) may exhibit droops in voltage due to increased current demand by these various circuits as briefly discussed above.

In the FLL of FIG. 2, an oscillator 210 generates the system clock signal 140. In this embodiment, the oscillator 210 is a digitally controlled oscillator (DCO) such that a digital error signal 221 is used as a feedback signal to continually adjust the output of the DCO 210 (i.e., the system clock signal 140). The digital error signal 221 is generated from a digital integrator 220 that receives a feedback signal 232 from a cycle counter 230 which is coupled to the system clock signal 140 (e.g., the output of the DCO 210 to provide feedback).

In operation, the DCO 210 may be synchronized to an external frequency reference 231 which is used as an input to the digital counter 230. The frequency of this external reference signal is typically a low frequency signal that is used as a reset signal to the digital counter 230. In this manner, the digital counter 230 acts as a frequency divider, counting pulses from a system clock 140 (typically several MHz) and toggling the state of its output when the count reaches a specific and programmable value. The frequency of the output of the digital counter 230 can thus be defined by the number of pulses counted (of the system clock signal 140), and this generates a feedback signal 232 at the desired frequency to be used as input to the digital integrator 220. Thus, the digital counter 230 effectively compares the frequency of system clock signal 140 to a multiple of the frequency of a lower-frequency reference clock signal 231, and generates a feedback signal 232 in response to the comparison. For example, the digital counter 230 may cause the frequency of system clock 140 to be 2000 times (e.g., 2 GHz) the frequency of the reference clock (e.g., 1 MHz).

Further, the digital integrator 220 effectively provides a low-pass filter for the feedback signal 232 from the digital counter 230, and provides a digital control word 221 to a current control circuit 260 for the DCO 210 so as to set and maintain the frequency of system clock 140 at the desired frequency. In summary, the DCO 210, digital counter 230, and digital integrator 220 form a feedback loop that maintains the frequency of system clock 140 at a programmable multiple of the reference clock 231. The operation of the current control circuit 260 may be dependent upon the assertion or de-assertion of the droop voltage flag 115 as discussed further below.

Thus, when the droop-voltage flag 115 is de-asserted (e.g., the voltage of a supply voltage is maintained within a specific voltage level), one may say that the operation of the FLL 120 is in a normal mode. This is opposed to a droop-voltage mode when the droop-voltage flag 115 is asserted (as discussed next). In normal mode, the switch 265 is open and a control current signal 270 is generated through the current control circuit 260 for controlling the current controlled oscillator 250. This is done so through a current digital-to-analog converter (DAC) 240, such that the digital control word 221 is converted into an analog current signal. Further, a subtractor DAC 245 also receives the digital control word 221 and converts it into a similar analog current signal.

The current control circuit 260 includes an internal voltage supply rail Vdd. The DAC 240 draws a current I through transistor M2 from the Vdd rail. For the purposes herein, this current I will simply be referred to as I and derives from a combination of a current source coupled to the Vdd rail as adjusted by the digital control word 221 via the DAC 240. This current I is mirrored on transistor M3 and M4. The transistor M3 includes a drain terminal coupled to the subtractor DAC 245 and therefore draws a current from the drain terminal of approximately one half of the current through the transistor M2, i.e., I/2. The other half of the current I is sunk through transistor M5 to ground. During operation, the current through the subtractor DAC 245 will always remain at I/2. The purpose of this portion of the circuit is to establish a current through transistor M5 as approximately one half of the current I though transistor M2 and M3.

Still referring to a normal mode of operation, the current I is also mirrored through transistor M4. Of course, in normal mode, the droop-voltage flag 115 is not set and the switch 265 is open. Therefore, no current may flow through transistor M6 and the entire current I flows into the current controlled oscillator 250 as the oscillator control signal 270. Thus, in normal mode, any currents sunk by the subtractor DAC 245 may effectively be ignored as not affecting the generation of the system clock signal 140.

However, if the supply voltage is determined to have deviated too far below an expected level (e.g., drooped), then the voltage-droop flag 115 may be set and close the switch 265. When this occurs, first, the voltage-droop flag 115 freezes the digital control word 221 from the digital integrator at its current value; that is, the voltage-droop flag 115 causes the digital integrator 220 to effectively ignore the error signal 232 from the counter 230.

Further, with switch 265 closed, an additional current path is created for the current control signal 270. The current that is generated as a result of this path now opened up is mirrored from transistor M5 though transistor M6. This current is I/2. Thus, the control current signal 270 falls from I to I/2 as soon as the switch 265 closes. This, in turn, immediately causes the current-controlled oscillator 250 to begin generating a system clock signal 140 that is half of the previous frequency.

Shortly thereafter, the digital integrator 220 changes the value of the digital control word 221 such that the current generated by the current DAC 240 is reduced to the difference current (e.g., I/2). Likewise, the current generated by the subtractor DAC 245 remains at I/2 and the current sunk through the current mirror of M5 and M6 begins to fall toward zero current. Thus, as the current through the current DAC 240 begins to track lower (e.g., eventually settling on a current I/2), the current-controlled oscillator 250 continues to receive the same value of a current control signal 270 (e.g., I/2). That is, the subtractor DAC 245 serves the purpose of quickly reducing the frequency of the system clock signal 140 until the digital integrator 220 has a chance to reduce the current from the current DAC 240 and the additional current from the current DAC above a value of I/2 is sunk though the current mirror of M5 and M6 until reaching equilibrium. The FLL 120 remains in this droop-voltage mode of operation until the droop voltage flag 115 is de-asserted.

Keeping focus on FIG. 2, the droop voltage flag may be cleared (e.g., de-asserted) in any manner of ways as discussed below with respect to FIG. 3. When the droop-voltage flag 115 is de-asserted, the switch 265 once again opens up and creates an open circuit leg through transistor M6. Further, the digital integrator 220 begins to change the digital control word 221 back toward its pre-droop mode value (which the digital integrator 220 previously stored in response to the droop voltage flag 115). The digital integrator 220 may be configured to cause the digital control word 221 to ramp back to its initial value using a number of possible methods. In one embodiment, the digital integrator 220 begins biasing the digital control word 221 back to its initial value at a programmable rate. The programmable rate may be steady ramp function (both linearly steady and exponentially steady) or segmented, and may even be non-monotonic. Therefore, the current generated by the current DAC 240 ramps back up to I at the same programmable rate, as does the current sunk by the transistor M5 ramp back up to I/2 (or whatever other fraction of I for which it is programmed) at the same programmed rate. Likewise, the frequency of system clock signal 140 eventually also ramps back up its initial frequency in a controlled manner at the same programmable rate.

Additional control parameters may be in place to guard against situations where the supply voltage droops again before returning to an initial frequency or in situations where the supply voltage droops continuously after getting back to an initial frequency (e.g., chattering). In one embodiment, if the supply voltage droops again before the frequency of system clock signal 140 ramps back up to F, then the FLL 120 repeats the above procedure without waiting for system clock signal 140 to ramp back up to F. That is, the voltage-droop flag 115 is again set, and the procedure repeats. Thus, the digital integrator 220 is in the midst of biasing the digital control word 221 back to its pre-droop value, when the droop-voltage flag 115 is set and the switch is closed—creating a current path of approximately half of the current control signal to sink through transistor M6 again.

In another embodiment, if the FLL 120 may be a droop-voltage mode for an extended period of time. Thus, additional factors such as temperature and environmental factors may alter what the best pre-droop-voltage frequency ought to be. That is, because the FLL 120 is not operating in normal mode for an extended period of time, other aspects of the clock generator 100 which may take into account temperature and ambient environment, have been suspended for some time and temperature and ambient conditions may no longer match the pre-droop-voltage frequency in which the digital integrator 220 has stored prior to the voltage-droop flag 115 being asserted. Thus, the FLL 120 may utilize the droop counter 234 counter to count system clock signal 140 pulses in response to the voltage-droop flag 115. When the voltage-droop flag 115 remains asserted and the count of this counter exceeds a programmable threshold, then, instead of ramping the value of the digital control word 221 back to its pre-droop-voltage value as described above, the FLL 120 may close the feedback loop immediately in response to clearing the voltage-droop flag (i.e., the voltage droop on the supply voltage is no longer present), so that the FLL 120 can acquire the proper value of the digital control word 221 to force the frequency of system clock signal back to F without following the programmed biasing function. Although this may be slower, it may be more accurate given the time that the FLL 120 was in voltage-droop mode.

In another embodiment, if the supply voltage continually droops before the frequency of system clock signal 140 returns to F, then the FLL 120 may dynamically increase the time for biasing the frequency of system clock signal 140 back to F after a reset of voltage-droop flag 115. That is, it may become apparent that using an initial biasing function to return the frequency of the system clock signal 140 back to F may be too fast and actually cause subsequent droops on the supply voltage as functionality of the systems is increased due to the rapidly increasing frequency of the system clock signal 140. As a result, a chattering effect (e.g., a consistent transition between droop-voltage mode and normal operation mode) may be affected. Therefore, the FLL 120 may be configured to recognize a number of transitions in a specific time period whereby the biasing function is adjusted in response.

Figure 3:
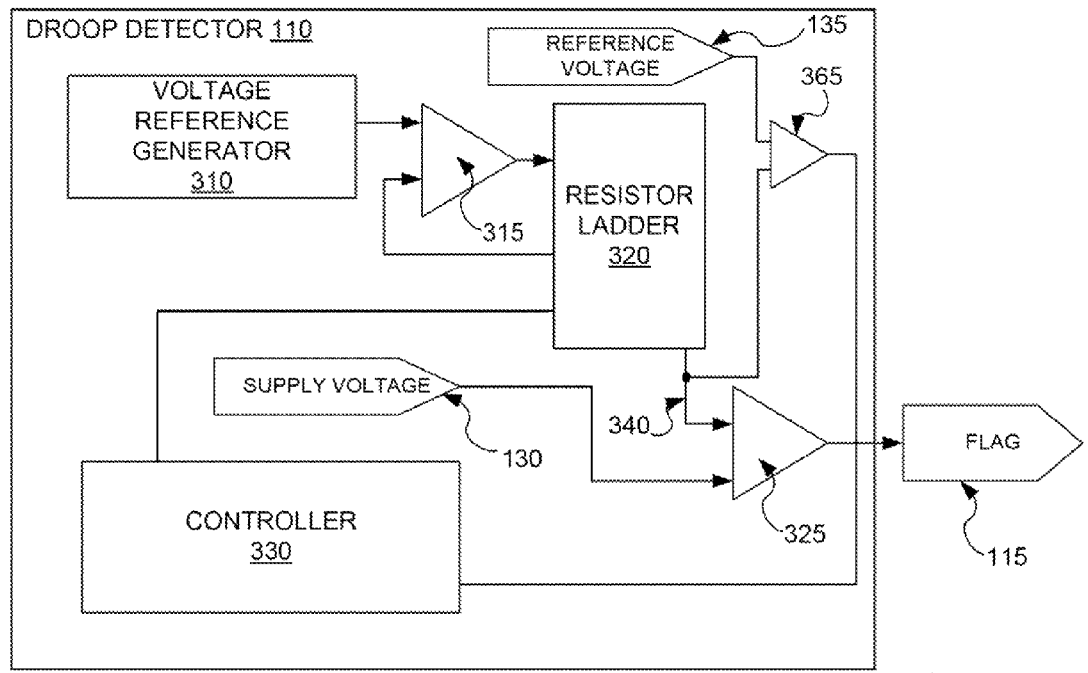
FIG. 3 shows a block diagram of a voltage-droop detection circuit that may be part of the clock generation circuit of FIG. 1 according to an embodiment of the subject matter disclosed herein.

Turning attention to the next figure, FIG. 3 shows a block diagram of a voltage-droop detection circuit 110 that may be part of the clock generation circuit 100 of FIG. 1 according to an embodiment of the subject matter disclosed herein. The droop voltage flag 115 may be set in response to a high-speed voltage comparator 325 detecting that the actual supply voltage 130 has fallen below a specific and programmable trip voltage or reference voltage 135. A threshold voltage 340 may be programmable using a resistor ladder 320 that may be controllable via a controller 330. Thus, the controller 330 may set a specific threshold voltage 340 via the resistor ladder 320. The droop detector 110 may include a first comparator 325 for receiving the threshold voltage 340 and a supply voltage 130. Further, the droop voltage detector 110 may also include comparator 365 for receiving the reference voltage 135 and the threshold voltage 340 that is set from the resistor ladder 320. When compared to the reference voltage 135, the effective trip voltage may be stored as a digital value via this feedback to the resistor ladder 320 in a simple manner e.g., via the controller 330. As can be expected, if the supply voltage 130 rises above the threshold voltage 340, the comparator 325 resets the voltage-droop flag 115 (e.g., de-asserts it). Likewise, if the threshold voltage falls below the supply voltage 130, then the voltage-droop flag 115 is set (e.g., asserted).

The clock generator 100 as described above with respect to FIGS. 1-3 exhibits a number of advantages over previous clock generators of the past. As briefly discussed above, conventional clock generators (not shown in any figure) may often employ a multiplexor circuit in an effort to reduce clock frequency in response to a detected voltage droop in the supply voltage. However, such the embodiments described provide better resolution at much lower power than a multiplexor. The current DAC 240 of FIG. 2 uses little extra circuitry than what is already present for the FLL 120. Thus, simply using the current DAC 240 in the additional ways described above eliminates any need for a cumbersome multiplexor. Further, the frequency of system clock signal 140 is biased back toward the initial frequency at its very own frequency thereby eliminating any frequency-limiting factor as is present with a multiplexor and eliminating any delays associated with the elements of the multiplexor itself.

In yet another advantage, the various ways in which the clock generator 100 biases the system clock signal 140 frequency back to its initial frequency does not utilize any manner of phase switching that is used in a multiplexor-based system. Switching between phases of a clock signal generates jitter on the system clock signal 140 that is not desirous. Thus, the biasing functions do not introduce any phase-switching jitter.

Further yet, by using a voltage-droop flag 115, the clock generator 100 of FIG. 1-3 provides an indication of a voltage droop in an asynchronous manner. That is, the voltage-droop flag 115 is generated independent of the system clock signal 140. Thus, setting voltage-droop flag 115 switches in the current mirror (M5-M6) to the path of the current control signal 270 to the oscillator 250, and because this switching in of the current mirror (M5-M6) can be done at any time, it is asynchronous. That is, the setting of voltage-droop flag 115 does not need to wait for an edge of system clock signal 140, or an edge of any other clock.

Figure 4:
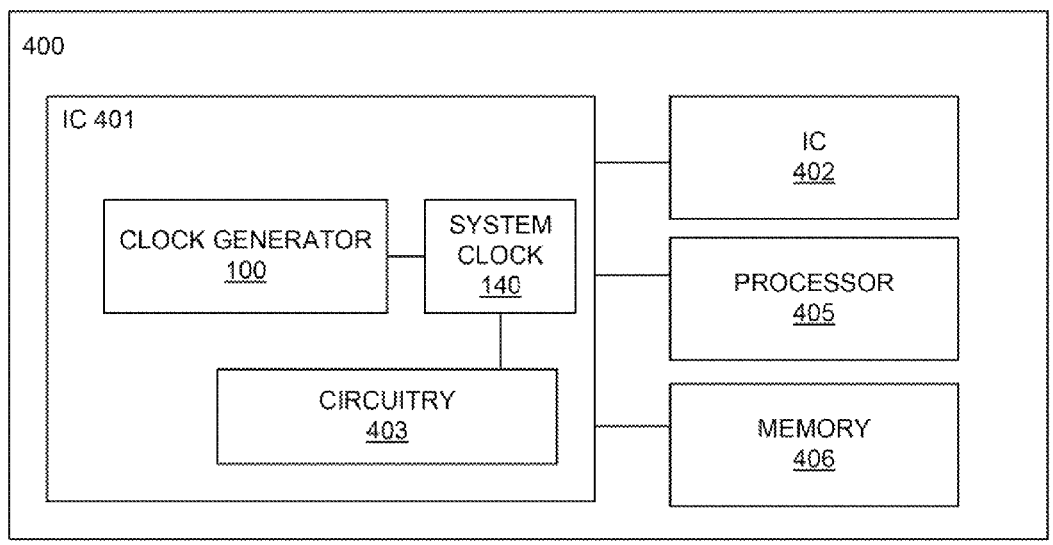
FIG. 4 shows a block diagram a system that may include the clock generation circuit of FIG. 1 according to an embodiment of the subject matter disclosed herein.

The clock generator 100 described above with respect to FIGS. 1-3 may be part of an overall system as well. FIG. 4 shows a block diagram a system 400 that may include the clock generation circuit 100 of FIG. 1 according to an embodiment of the subject matter disclosed herein. The clock generator 100 may be disposed on a single integrated circuit die 401 as shown, or may be disposed across more than one integrated circuit die such as a second integrated circuit die 402 that is shown as coupled to the first integrated circuit die. The first or second integrated circuit dies may also include additional circuitry such as circuitry 403 s shown disposed on integrated circuit 401.

Further yet, the system 400 may also include a processor 405 and a memory 406 coupled to the clock generator 100. These additional components may also be disposed on speared integrated circuit dies on the same integrated circuit die with the clock generator 100. These additional components may also employ use of the system clock 140 generated by the clock generator 100 of the system 400.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A clock generation circuit, comprising:
    a detection circuit configured to detect a change in a voltage supply signal coupled to the clock generation circuit; and
    a control circuit coupled to the detection circuit and configured to alter a control signal for regulating a current-controlled oscillator in response to detecting the change.

2. The clock generation circuit of claim 1, wherein the detection circuit is further configured to detect a voltage droop in the voltage supply signal beyond a threshold.

3. The clock generation circuit of claim 1, wherein the detection circuit is further configured to generate a flag indicative of the change and configured to actuate a switch in the control circuit.

4. The clock generation circuit of claim 1, wherein the current-controlled oscillator comprises a digital current-controlled oscillator.

5. The clock generation circuit of claim 1, wherein the control circuit further comprises a frequency-locked loop having:
    a digital current-controlled oscillator;
    a digital counter coupled to the digital current-controlled oscillator and configured to count edges of a clock signal generated by the digital current-controlled oscillator; and
    a digital integrator coupled to the digital counter and configured to generate a digital control word in response to the digital counter and further configured to alter an output of the digital current-controlled oscillator in response to the generated digital control word.

6. The clock generation circuit of claim 1, wherein the oscillator further comprises:
    a first digital-to-analog converter configured to provide a first control current signal to the current-controlled oscillator; and
    a second digital-to-analog converter configured to remove current from the current control signal when engaged.

7. The clock generation circuit of claim 6, wherein the current-controlled oscillator further comprises a control circuit having:
    a first transistor having a first conduction node coupled to a first supply node, a second conduction node coupled to the first digital-to-analog converter and a control node coupled to the second conduction node;
    a second transistor having a first conduction node coupled to the first supply node, a second conduction node coupled to the second digital-to-analog converter and a control node coupled to the control node of the first transistor;
    a third transistor having a first conduction node coupled to the first supply node, a second conduction node coupled to the oscillator and a control node coupled to the control node of the first transistor;
    a fourth transistor having a first conduction node coupled to a second supply node, a second conduction node coupled to the second digital-to-analog converter and a control node coupled to the second conduction node of the fourth transistor;
    a fifth transistor having a first conduction node coupled to the second supply node, a second conduction node and a control node coupled to the control node of the fourth transistor; and
    a switch controllable by the detection circuit and coupled between the oscillator and the second conduction node of the fifth transistor.

8. The clock generation circuit of claim 1, wherein the detection circuit further comprises:
    a comparator configured to compare a supply voltage signal to a threshold signal;
    a resistor ladder coupled to the comparator and configured to generate the threshold signal; and
    a controller coupled to the resistor ladder and configured to control the generation of the threshold signal.

9. The clock generation circuit of claim 8, wherein the detection circuit is further configured to generate a flag if the comparator determines that the supply voltage signal falls below the threshold signal, the flag configured to cause the control circuit to alter the control signal used to regulate the oscillator.

10. A method, comprising:
    monitoring a supply voltage;
    generating a digital control word for generating the clock signal; and
    in response to detecting the supply voltage falling below a threshold, causing a clock signal to be reduced by ramping the digital control word toward generating a clock signal with a lower frequency.

11. The method of claim 10, wherein the reduction of the clock signal further comprises reducing the clock signal to half.

12. The method of claim 10, further comprising:
    generating a control current having a first magnitude for generating the clock signal prior to the detecting the supply voltage falling below a threshold; and
    generating the control current having a second magnitude that is one half of the first magnitude after the detecting the supply voltage falling below a threshold.

13. The method of claim 10, further comprising generating a condition flag in response to the detecting the supply voltage falling below a threshold.

14. The method of claim 13, further comprising closing a switch in response to the generation of the condition flag.

15. The method of claim 13, further comprising counting the clock cycles during the time that the condition flag is set and clearing the condition flag after a threshold count is reached.

16. The method of claim 13, further comprising clearing the condition flag in response to detecting the supply voltage rising above the threshold.

17. The method of claim 16, further comprising generating a digital control word configured to ramp the clock frequency toward an initial frequency.

18. The method of claim 17 wherein the ramp comprises a linear ramp.

19. The method of claim 17 wherein the ramp comprises an exponential ramp.

20. A method, comprising:
generating a clock signal in a frequency locked loop, the frequency of the clock signal controlled by a control signal;
in response to detecting a supply voltage falling below a threshold voltage;
subtracting current from the control signal.

21. The method of claim 20, wherein the current subtracted comprises one half of the current of the control signal prior to the detecting.

22. The method of claim 20, wherein the current subtracted is subtracted immediately after the detecting.

23. A system, comprising:
a voltage supply node
a first electronic component having a clock generator circuit and coupled to the voltage supply node, including:
a detection circuit configured to detect a change in voltage at the voltage supply node; and
a control circuit coupled to the detection circuit and configured to alter a control signal for regulating a current-controlled oscillator in response to detecting the change; and
a second electronic component coupled to the first electronic component.

24. The system of claim 23, wherein one of the first and second electronic components comprises a processor.

25. The system of claim 23, wherein one of the first and second electronic components comprises single integrated circuit die.

26. The system of claim 23, wherein one of the first and second electronic components comprises multiple integrated circuit dies.

27. An integrated circuit, comprising:
a voltage supply node;
a detection circuit configured to detect a change in voltage at the voltage supply node; and
a control circuit coupled to the detection circuit and configured to subtract current from a control signal for regulating a system clock in response to detecting the change.

28. An integrated circuit, comprising:
a voltage supply node
a detection circuit configured to detect a change in voltage at the voltage supply node; and
a control circuit coupled to the detection circuit and configured to engage a current sink that sinks half of a current of a control signal for regulating a system clock in response to detecting the change.

29. An integrated circuit, comprising:
a voltage supply node
a detection circuit configured to detect a change in voltage at the voltage supply node; and
a control circuit coupled to the detection circuit and configured to immediately ramp a system clock signal in response to detecting the change.

* * * * *